United States Patent
Li

(10) Patent No.: US 9,830,855 B1
(45) Date of Patent: Nov. 28, 2017

(54) FOLDABLE DISPLAY DEVICE AND DRIVE METHOD THEREOF

(71) Applicant: Wuhan China Star Optoelectronics Technology Co., Ltd., Wuhan (CN)

(72) Inventor: Jun Li, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/231,794

(22) Filed: Aug. 9, 2016

(30) Foreign Application Priority Data

May 30, 2016 (CN) .......................... 2016 1 0371535

(51) Int. Cl.
  *G09G 3/3225* (2016.01)
  *H01L 27/32* (2006.01)
  *G09G 3/3266* (2016.01)
  *H01L 51/00* (2006.01)
  *G06F 1/16* (2006.01)

(52) U.S. Cl.
  CPC ......... *G09G 3/3225* (2013.01); *G06F 1/1652* (2013.01); *G09G 3/3266* (2013.01); *H01L 27/3211* (2013.01); *H01L 27/3248* (2013.01); *H01L 27/3276* (2013.01); *H01L 51/0097* (2013.01); *G09G 2330/021* (2013.01); *H01L 2251/5338* (2013.01)

(58) Field of Classification Search
  CPC ............... G09G 3/3225; G09G 3/3266; G09G 2330/021; H01L 27/3211; H01L 51/0097; H01L 27/3276; H01L 27/3248; H01L 2251/5338; G06F 1/1652
  See application file for complete search history.

(56) References Cited

U.S. PATENT DOCUMENTS

| | | | |
|---|---|---|---|
| 9,552,127 B2 * | 1/2017 | Jano ....................... | G06F 1/1641 |
| 2015/0293620 A1 * | 10/2015 | Cho ........................ | G06F 1/1643 |
| | | | 345/173 |
| 2015/0301672 A1 * | 10/2015 | Kim ......................... | G09G 3/20 |
| | | | 345/156 |
| 2015/0316958 A1 * | 11/2015 | Takesue .................. | G06F 3/044 |
| | | | 345/173 |
| 2015/0317007 A1 * | 11/2015 | Yanagawa ............. | G06F 1/1652 |
| | | | 463/37 |
| 2015/0355680 A1 * | 12/2015 | Yamazaki ............. | G06F 1/1616 |
| | | | 361/679.27 |

(Continued)

*Primary Examiner* — Andrew Sasinowski
(74) *Attorney, Agent, or Firm* — Leong C. Lei

(57) ABSTRACT

Disclosed are a foldable display device and a drive method thereof. Control switch units of one column are respectively located in the first display region (100) and the second display region (200) and located adjacent to the sub pixels (10) of two columns, and each scan line is correspondingly coupled to one of the control switch units, and the control switch unit activates or deactivates the second and the third display regions under control of a control signal (En). As performing folding display, the control signal (En) provides a deactivation signal to deactivate all the control switch units, and the scan signal (Scan) is only transmitted to the first display region (100), but not transmitted to the second and the third display region (300, 500), and thus the first display region (100) emits light, and the second display region (300) and the third display region (500) do not emit light.

10 Claims, 8 Drawing Sheets

(56) References Cited

U.S. PATENT DOCUMENTS

| | | | | |
|---|---|---|---|---|
| 2017/0003793 A1* | 1/2017 | Gao | .................... | G06F 3/0416 |
| 2017/0011714 A1* | 1/2017 | Eim | .................... | G06F 1/1677 |
| 2017/0018250 A1* | 1/2017 | Shai | .................... | G06F 1/1615 |
| 2017/0023978 A1* | 1/2017 | Cho | .................... | G06F 1/1652 |

* cited by examiner step 1, providing a foldable display device, comprising: a flexible substrate (1), a plurality of horizontal scan lines (S1-Sn), which are mutually parallel and in interval on the flexible substrate (1), and a plurality of sub pixels (10) aligned in array on the flexible substrate (1); wherein one scan line is located corresponding to the sub pixels (10) of each row, and the sub pixels (10) at the same row are electrically coupled to the same scan line; the flexible substrate (1) comprises: a first display region (100), a first folding region (200), a second (2) display region (300), a second folding region (400) and a third display (3) region (500), which are aligned in sequence along a horizontal direction; (4) control switch units of one column are respectively located in the first (5) display region (100) and the second display region (300) and located (6) adjacent to the sub pixels (10) of two columns, and each scan line is (7) correspondingly coupled to one of the control switch units, and the control (8) switch unit activates or deactivates the second display region (300) and the (9) third display region (500) under control of a control signal (En); ⌐1 step 2, performing folding display to fold the first display region (100), the second display region (300) and the third display region (500) along the first folding region (200) and the second folding region (400) to make that the first display region (100) shades the second display region (300), and the second display region (300) shades the third display region (500), and the control signal (En) provides a deactivation signal to deactivate all the control switch units, and thus the first display region (100) emits light, and both the second display region (300) and the third display region (500) do not emit light; ⌐2 step 3, performing unfolding display to unfold the first display region (100), the second display region (300) and the third display region (500) along the first folding region (200) and the second folding region (400) to the same plane to make that all the first display region (100), the second display region (300) and the third display region (500) are revealed, and the control signal (En) provides an activation signal to activate all the control switch units, and thus all the first, the second and the third display regions (100, 300, 500) emit light. ⌐3

Fig. 8

FOLDABLE DISPLAY DEVICE AND DRIVE METHOD THEREOF

FIELD OF THE INVENTION

The present invention relates to a display technology field, and more particularly to a foldable display device and a drive method thereof.

BACKGROUND OF THE INVENTION

The Organic Light Emitting Diodes (OLED) display device possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED display element is a self-emitting type display device, and generally comprises a pixel electrode and a common electrode respectively employed as being the anode and the cathode, and an organic light emitting layer positioned between the pixel electrode and the common electrode. As the proper voltages are applied to the anode and the cathode, the organic light emitting layer emits light. The organic light emitting layer comprises a Hole Injection Layer positioned on the anode, a Hole Transporting Layer positioned on the Hole Injection Layer, a light emitting layer positioned on the Hole Transporting Layer, an Electron Transport Layer positioned on the light emitting layer and an Electron Injection Layer positioned on the Electron Transport Layer. The lighting principle is that under certain voltage driving, the Electron and the Hole are respectively injected into the Electron Injection Layer and Hole Electron Injection Layer from the cathode and the anode. The Electron and the Hole respectively migrate from the Electron Transporting Layer and Hole Transporting Layer to the Emitting layer and bump into each other in the Emitting layer to form an exciton to excite the emitting molecule. The latter can illuminate after the radiative relaxation.

With the requirement of the people for the portable display apparatus gets bigger and bigger, the flexible display technology has become one of the display technologies which have extreme competitive advantage. The one biggest advantage of the flexible display technology is to possess the foldability, which can occupy smaller space under the premise of providing a larger display region. Please refer to FIG. 1 and FIG. 2, which are diagrams of unfolding structure and folding structure of the three levels foldable display device according to prior art. The foldable display device comprises a first display region 100', a first folding region 200', a second display region 300', a second folding region 400' and a third display region 500', which are continuously aligned from left to right along a horizontal direction. The foldable display device can be folded at the first folding region 200' and the second folding region 400' to achieve the foldable function. In prior art, the drive circuit of the foldable and flexible display device is designed to be the dual side drive. With the length increase of the foldable display device, the power consumption of the drive circuit will greatly increase. For the OLED pixel circuit with compensation design, the drive signal needs to drive a plurality of Thin film transistors (TFT), and the power consumption of the drive circuit will be larger. In general, after the foldable display device is folded, the display is only performed on the first display region 100' on the top, and the second and the third display region 300', 500' do not require showing images because of being folded and shaded. In prior art, the data signal is not inputted so that the other display regions do not perform display for saving the electrical power. However, after being folded, the scan drive signal still drive the TFTs in the second and the third display region 300', 500' and cause the electrical power waste to shorten the mobile apparatus usage duration and influence the user experience. Meanwhile, the loading of the drive circuit is larger, the voltage drop happens to the TFT gates of the first display region 100' away from the drive signal, and the display quality is descended.

SUMMARY OF THE INVENTION

An objective of the present invention is to provide a foldable display device, which can reduce the electrical power consumption, and extend the usage duration of the mobile apparatus, and promote the user experience, and meanwhile, diminish the scan signal loading as folding display to promote the display quality.

Another objective of the present invention is to provide a drive method of a foldable display device, which can reduce the electrical power consumption, and extend the usage duration of the mobile apparatus, and promote the user experience, and meanwhile, diminish the scan signal loading as folding display to promote the display quality.

For realizing the aforesaid objectives, the present invention first provides a foldable display device, comprising: a flexible substrate, a plurality of horizontal scan lines, which are mutually parallel and in interval on the flexible substrate, and a plurality of sub pixels aligned in array on the flexible substrate;

wherein one scan line is located corresponding to the sub pixels of each row, and the sub pixels at the same row are electrically coupled to the same scan line;

the flexible substrate comprises: a first display region, a first folding region, a second display region, a second folding region and a third display region, which are continuously aligned in sequence along a horizontal direction;

control switch units of one column are respectively located in the first display region and the second display region and located adjacent to the sub pixels of two columns, and each scan line is correspondingly coupled to one of the control switch units, and the control switch unit activates or deactivates the second display region and the third display region under control of a control signal.

The control switch unit is a control TFT, and a source and a drain of the control TFT are electrically coupled to a scan line of two sides thereof, respectively, and a gate of the control TFT is electrically coupled to the control signal.

The control switch units are in the first folding region.

The control switch units are in the second display region.

The device further comprises: a first gate driver located at one side of the first display region, which is away from the second display region, and a second gate driver located at one side of the third display region, which is away from the second display region;

both the first gate driver and the second gate driver are electrically coupled to the plurality of horizontal scan lines, which are mutually parallel and in interval;

the second gate driver is electrically coupled to the control signal.

The first display region, the first folding region, the second display region, the second folding region and the third display region are continuously aligned from left to right along a horizontal direction;

a control TFT is located on each scan line corresponding to a position between the sub pixels of one column at the most right side of the first display region and the sub pixels of one column at the most left side of the second display region, and a source of the control TFT is electrically coupled to a portion of a left side of the scan line where the control TFT is, and a drain is electrically coupled to a portion of a right side of the scan line where the control TFT is, and a gate is electrically coupled to the control signal.

The present invention further provides a drive method of a foldable display device, comprising steps of:

step 1, providing a foldable display device, comprising: a flexible substrate, a plurality of horizontal scan lines, which are mutually parallel and in interval on the flexible substrate, and a plurality of sub pixels aligned in array on the flexible substrate;

wherein one scan line is located corresponding to the sub pixels of each row, and the sub pixels at the same row are electrically coupled to the same scan line;

the flexible substrate comprises: a first display region, a first folding region, a second display region, a second folding region and a third display region, which are aligned in sequence along a horizontal direction;

control switch units of one column are respectively located in the first display region and the second display region and located adjacent to the sub pixels of two columns, and each scan line is correspondingly coupled to one of the control switch units, and the control switch unit activates or deactivates the second display region and the third display region under control of a control signal;

step 2, performing folding display to fold the first display region, the second display region and the third display region along the first folding region and the second folding region to make that the first display region shades the second display region, and the second display region shades the third display region, and the control signal provides a deactivation signal to deactivate all the control switch units, and thus the first display region emits light, and both the second display region and the third display region do not emit light;

step 3, performing unfolding display to unfold the first display region, the second display region and the third display region along the first folding region and the second folding region to the same plane to make that all the first display region, the second display region and the third display region are revealed, and the control signal provides an activation signal to activate all the control switch units, and thus all the first, the second and the third display regions emit light.

The control switch unit is a control TFT, and a source and a drain of the control TFT are electrically coupled to a scan line of two sides thereof, respectively, and a gate of the control TFT is electrically coupled to the control signal.

The control switch units are in the second display region or the first folding region.

The device further comprises: a first gate driver located at one side of the first display region, which is away from the second display region, and a second gate driver located at one side of the third display region, which is away from the second display region;

both the first gate driver and the second gate driver are electrically coupled to the plurality of horizontal scan lines, which are mutually parallel and in interval;

the second gate driver is electrically coupled to the control signal;

in the step 2, the control signal provides a deactivation signal to make the second gate driver stop working;

in the step 3, the control signal provides an activation signal to make the second gate driver normally work.

The benefits of the present invention are: in the foldable display device provided by the present invention, control switch units of one column are respectively located in the first display region and the second display region and located adjacent to the sub pixels of two columns, and each scan line is correspondingly coupled to one of the control switch units. As unfolding display, the control signal provides an activation signal to activate all the control switch units, and the scan signal is transmitted to the first, the second and the third display regions, and thus all the first, the second and the third display regions emit light. As performing folding display, the control signal provides a deactivation signal to deactivate all the control switch units, and the scan signal is only transmitted to the first display region, but not transmitted to the second and the third display region, and thus the first display region emits light, and both the second display region and the third display region do not emit light. It can reduce the electrical power consumption of the foldable display device as folding display, and extend the usage duration of the mobile apparatus, and promote the user experience, and meanwhile, diminish the scan signal loading as folding display to promote the display quality. The drive method of the foldable display device provided by the present invention can reduce the electrical power consumption, and extend the usage duration of the mobile apparatus, and promote the user experience, and meanwhile, diminish the scan signal loading as folding display to promote the display quality.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings,

FIG. 8 is a flowchart of the drive method of the foldable display device according to the present invention.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
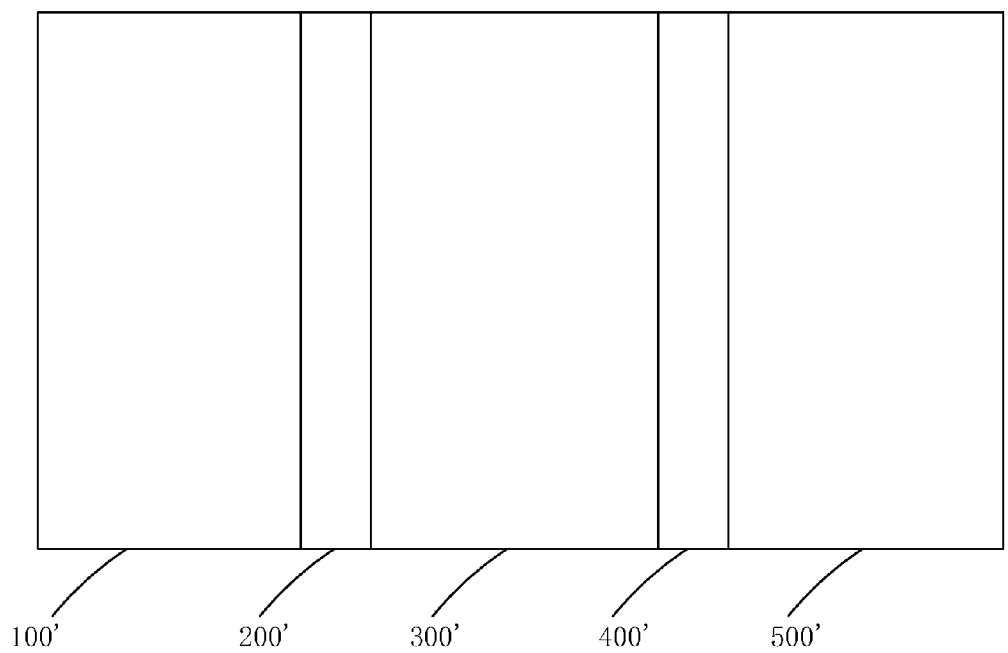
FIG. 1 is a diagram of an unfolding structure of the foldable display device according to prior art.
Figure 2:
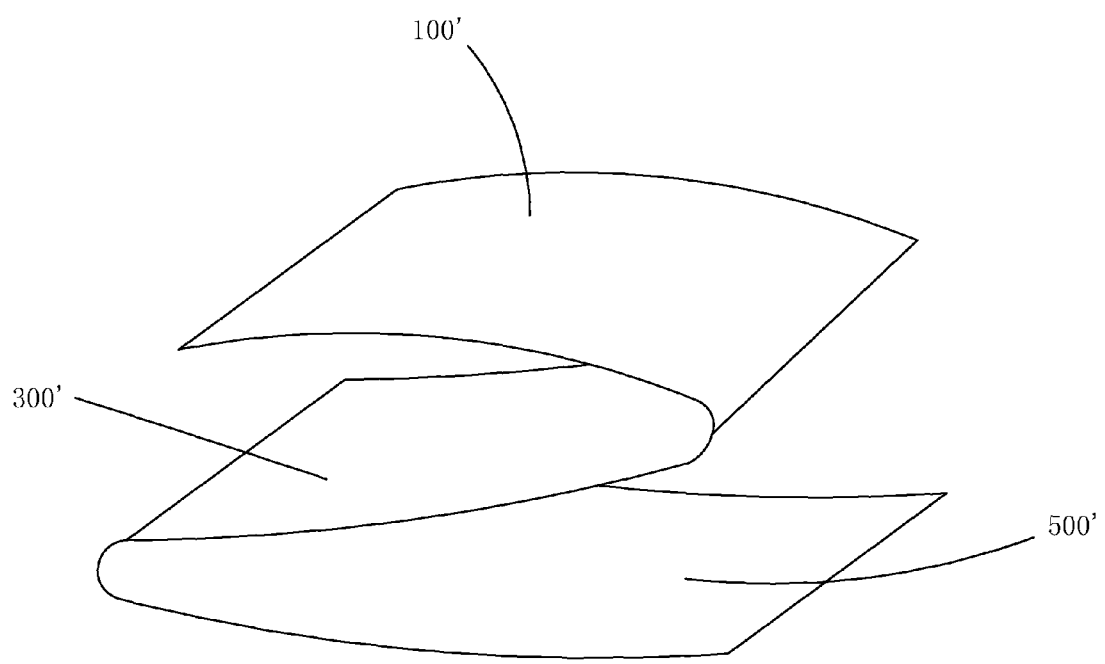
FIG. 2 is a diagram of a folding structure of the foldable display device shown in FIG. 1.
Figure 3:
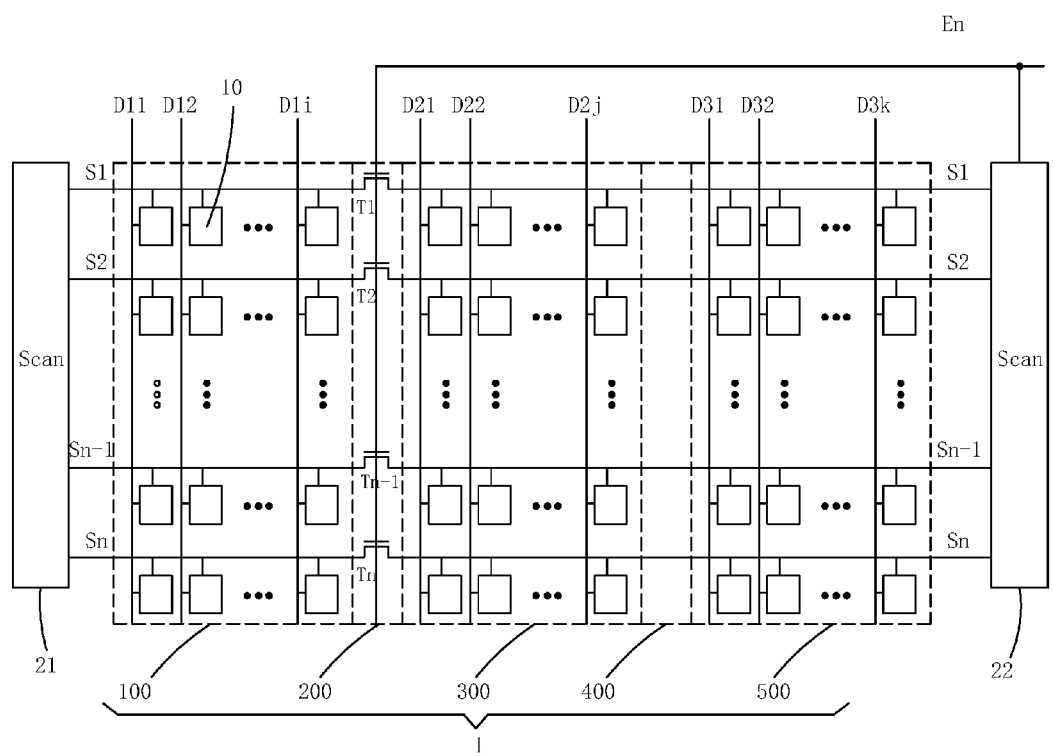
FIG. 3 is a circuit structure diagram of the first embodiment according to the foldable display device of the present invention.

Please refer to FIG. 3. The present invention provides a foldable display device, comprising: a flexible substrate 1, a plurality of horizontal scan lines S1-Sn, which are mutually parallel and in interval on the flexible substrate 1, and a plurality of sub pixels 10 aligned in array on the flexible substrate 1;

wherein one scan line is located corresponding to the sub pixels 10 of each row, and the sub pixels 10 at the same row are electrically coupled to the same scan line;

the flexible substrate 1 comprises: a first display region 100, a first folding region 200, a second display region 300, a second folding region 400 and a third display region 500, which are continuously aligned in sequence along a horizontal direction;

a control TFT is located on each scan line corresponding to a position between the sub pixels 10 of one column at the most right side of the first display region 100 and the sub pixels 10 of one column at the most left side of the second display region 200, and a source of the control TFT is electrically coupled to a portion of a left side of the scan line where the control TFT is, and a drain is electrically coupled to a portion of a right side of the scan line where the control TFT is, and a gate is electrically coupled to the control signal En.

Specifically, the flexible substrate 1 further comprises a plurality of data lines which are mutually parallel and in interval. i, j and k are set to be positive integers. The display region 100 comprises: data lines D11-D1$i$ of i columns, and n×i sub pixels 10 of n rows, i columns in total; the second display region 300 comprises: data lines D21-D2$j$ of j columns and n×j sub pixels 10 of n rows, j columns in total; the third display region 500 comprises: data lines D31-D3$k$ of k columns and n×k sub pixels 10 of n rows, k columns in total. The respective scan lines penetrate the first display region 100, the first folding region 200, the second display region 300, the second folding region 400 and the third display region 500 to connect together the sub pixels 10 of the same row in the first display region 100, the second display region 300 and the third display region 500.

Besides, the device further comprises: a first gate driver 21 located at the left side of the first display region 100, and a second gate driver 22 located at the right side of the third display region 500; both the first gate driver 21 and the second gate driver 22 are electrically coupled to the plurality of horizontal scan lines S1-Sn, which are mutually parallel and in interval; the second gate driver 22 is electrically coupled to the control signal En. Preferably, both the first gate driver 21 and the second gate driver 22 are manufactured in the GOA circuit on the flexible substrate 1. Both the first gate driver 21 and the second gate driver 22 comprise n output ends. Each output end is correspondingly coupled to one scan line. For instance, the left, right two ends of the first scan line S1 are respectively coupled to the first output end of the first gate driver 21 and the first output end of the second gate driver 22, and the left, right two ends of the second scan line S2 are respectively coupled to the second output end of the first gate driver 21 and the second output end of the second gate driver 22, and so on. The first gate driver 21 and the second gate driver 22 provide the scan signal Scan to the scan line from the left, right two ends at the same time.

Specifically, referring to FIG. 3, in the first embodiment of the present invention, the control TFT is in the first folding region 200. Preferably, all the n control TFTs T1-Tn are N type TFTs.

Figure 6:
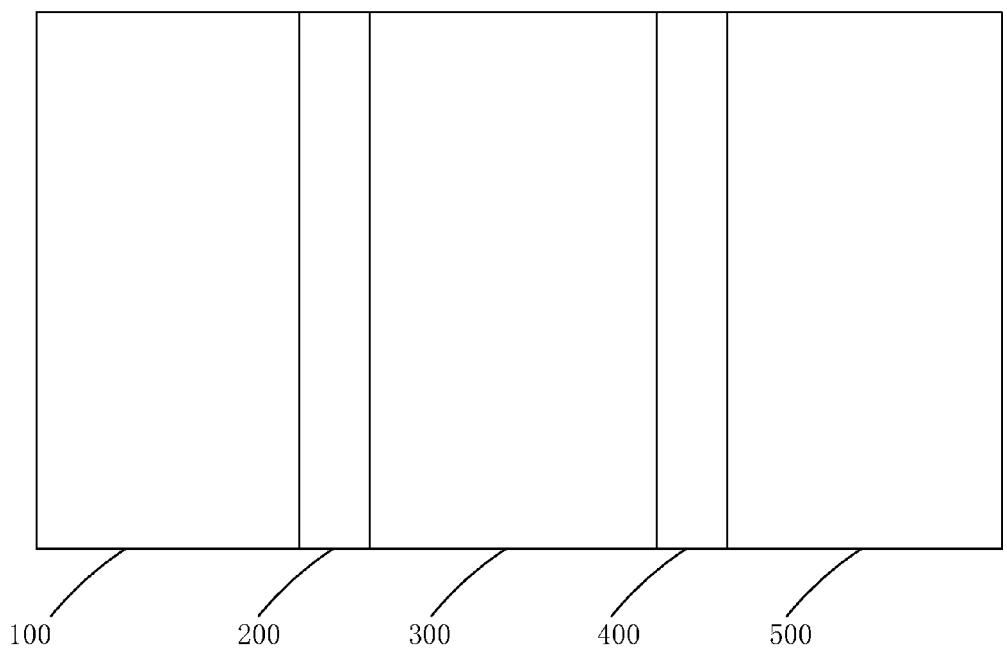
FIG. 6 is an unfolding structure diagram of the foldable display device according to the present invention.

Specifically, referring to FIG. 6, as the foldable display device performs unfolding display, the first display region, and the second display region and the third display region are unfolded to the same plane along the first folding region and the second folding region to make that all the first display region, the second display region and the third display region are revealed, the control signal En provides high voltage level to activate the n control TFTs T1-Tn, and two parts of the n scan lines S1-Sn at the left, right two sides of the control TFTs are electrically coupled, and the second gate driver 22 normally works so that the scan signal Scan can be inputted to the first display region 100, the second display region 300 and the third display region 500 to drive the first display region 100, the second display region 300 and the third display region 500 all emit light.

Figure 7:
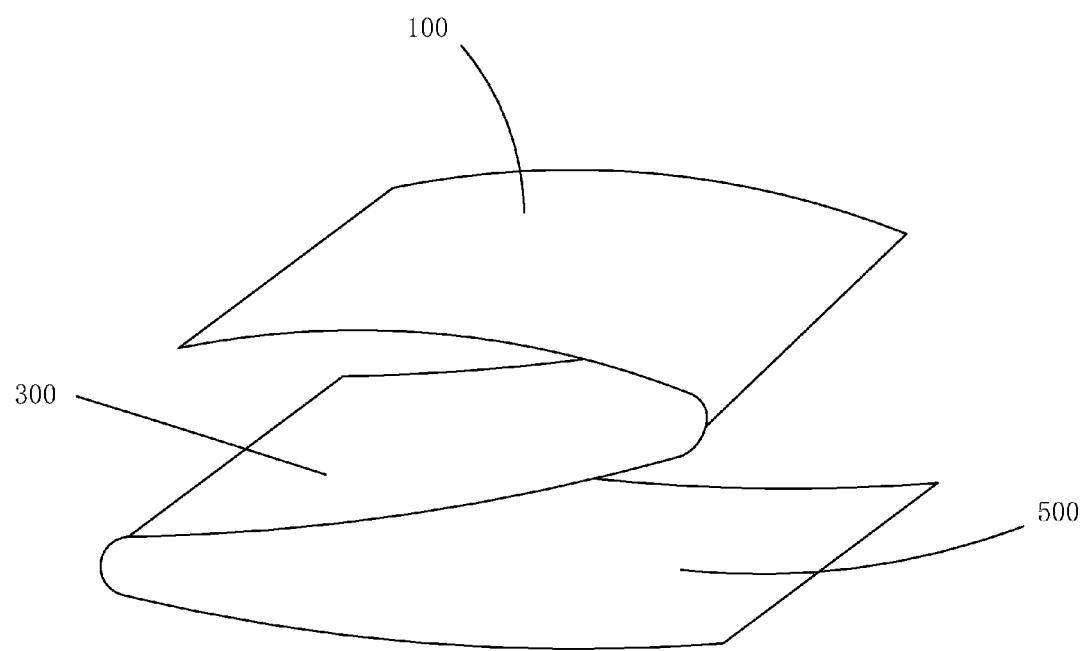
FIG. 7 is a folding structure diagram of the foldable display device according to the present invention.

Please refer to FIG. 7, as the foldable display device performs folding display, and the first display region, the second display region and the third display region are folded along the first folding region and the second folding region to make that the first display region shades the second display region and the second display region shades the third display region, the control signal En provides low voltage level to deactivate the n control TFTs T1-Tn, and both two parts of the n scan lines S1-Sn at the left, right two sides of the control TFTs are disconnected, and the second gate driver 22 stops working so that the scan signal Scan is only inputted to the first display region 100, but cannot be inputted to the second display region 300 and the third display region, and thus the first display region 100 emits light, and the second display region 300 and the third display region 500 do not emit light. In comparison with prior art, as the foldable display device of the present invention performs foldable display, the scan signal only needs to drive the first display region 100 on the top, and the second display region 300 and the third display region 500 do not have the scan signal Scan. It can reduce the electrical power consumption, and extend the usage duration of the mobile apparatus, and promote the user experience, and meanwhile, diminish the scan signal loading as folding display for decreasing voltage drop of the gate of the pixel TFT of the sub pixel in the first display region 100 which is away from the scan signal Scan to promote the display quality.

Figure 4:
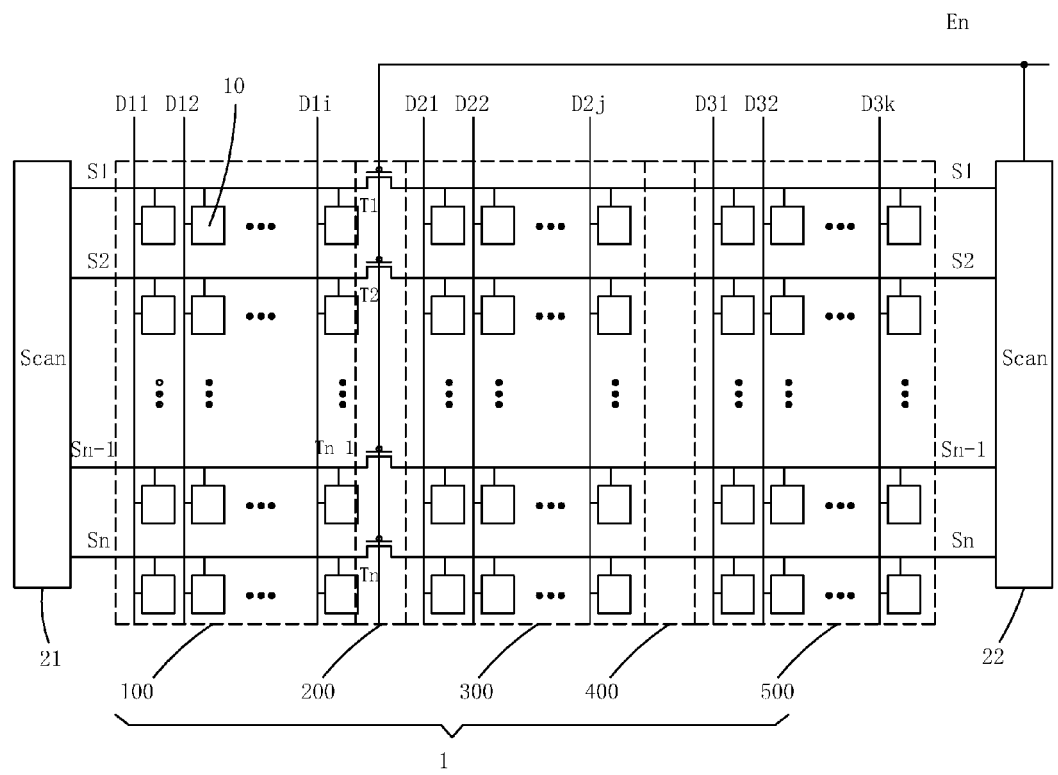
FIG. 4 is a circuit structure diagram of the second embodiment according to the foldable display device of the present invention.

Specifically, referring to FIG. 4, which is the second embodiment of the present invention. The difference of the second embodiment from the first embodiment is that all the n control TFTs T1-Tn are P type TFTs. As the foldable display device performs unfolding display, the control signal En provides low voltage level to activate all the n control TFTs T1-Tn, and two parts of the n scan lines S1-Sn at the left, right two sides of the control TFTs are electrically coupled, and the second gate driver 22 normally works so that the first display region 100, the second display region 300 and the third display region 500 all emit light; as the foldable display device performs folding display, the control signal En provides high voltage level to deactivate all the n control TFTs T1-Tn, and the two parts of the n scan lines S1-Sn at the left, right two sides of the control TFTs are disconnected, and the second gate driver 22 stops working so that the scan signal Scan drives the first display region 100 emit light, and both the second display region 300 and the third display region 500 do not emit light. The reset is the same as the first embodiment. The repeated description is omitted here.

Figure 5:
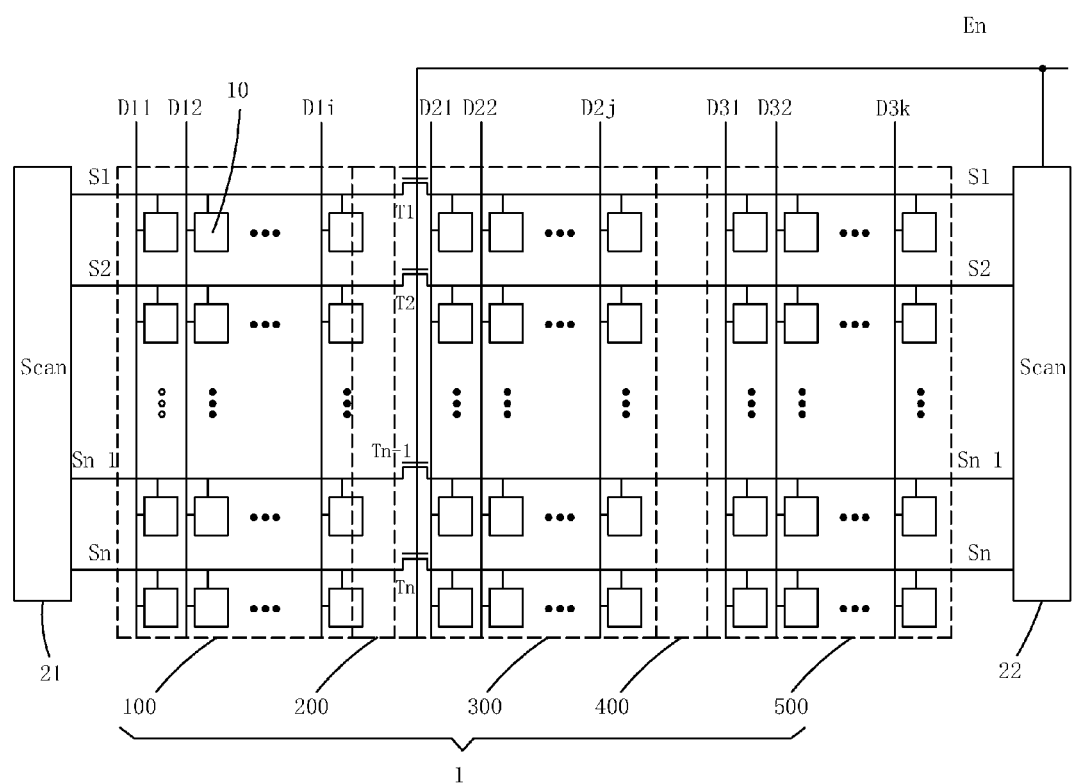
FIG. 5 is a circuit structure diagram of the third embodiment according to the foldable display device of the present invention.

Specifically, referring to FIG. 5, which is the third embodiment of the present invention. The difference of the third embodiment from the first embodiment is that the n control TFTs T1-Tn are located at one side of the second display region 300 which is close to the first folding region 200. The rest are the same as the first embodiment. The repeated description is omitted here. In comparison with the first embodiment that the control TFTs are located in the first folding region 200, the control TFTs are located in the second display region 300 to diminish the influence of folding to the control TFTs to promote the stability of the products.

Please refer to FIG. 8. The present invention further provides a drive method of a foldable display device, comprising steps of:

step 1, providing a foldable display device. The specific structure is the same as that of the aforesaid foldable display device. The repeated description is omitted here.

step 2, performing folding display to fold the first display region 100, the second display region 300 and the third display region 500 along the first folding region 200 and the second folding region 400 to make that the first display region 100 shades the second display region 300, and the second display region 300 shades the third display region 500, and the control signal En provides a deactivation signal to deactivate all the control switch units, and thus the first display region 100 emits light, and both the second display region 300 and the third display region 500 do not emit light.

Specifically, as the control TFTs are N type TFTs, the deactivation signal is a low voltage level signal. As the control TFTs are P type TFTs, the deactivation signal is a high voltage level signal. In the step 2, the control signal En provides a deactivation signal to further make the second gate driver 22 stop working.

step 3, performing unfolding display to unfold the first display region 100, the second display region 300 and the third display region 500 along the first folding region 200 and the second folding region 400 to the same plane to make that all the first display region 100, the second display region 300 and the third display region 500 are revealed, and the control signal En provides an activation signal to activate all the control switch units, and thus all the first, the second and the third display regions 100, 300, 500 emit light.

Specifically, as the control TFTs are N type TFTs, the activation signal is a high voltage level signal. As the control TFTs are P type TFTs, the activation signal is a low voltage level signal. In the step 3, the control signal En provides an activation signal En to further make the second gate driver 22 normally work.

It can be understood that the control switch units employed for controlling the second display region and the third display region in the present invention are not limited to be the control TFTs in the embodiment but also can be other common switch circuit units. The detail description is omitted, here.

Similarly, it can be understood that the first display region 100, the first folding region 200, the second display region 300, the second folding region 400 and the third display region 500 are not limited to be continuously aligned from left to right along a horizontal direction in the embodiment of the present invention but also can be continuously aligned from right to left along a horizontal direction. The specific circuit principle and design are basically the same as this embodiment. Only for meeting the change of the folding direction of the display device, the alignment direction of the circuit is also adaptively adjusted. Here, no specific description is presented here, either.

In conclusion, in the foldable display device of the present invention, control switch units of one column are respectively located in the first display region and the second display region and located adjacent to the sub pixels of two columns, and each scan line is correspondingly coupled to one of the control switch units. As unfolding display, the control signal provides an activation signal to activate all the control switch units, and the scan signal is transmitted to the first, the second and the third display regions, and thus all the first, the second and the third display regions emit light. As performing folding display, the control signal provides a deactivation signal to deactivate all the control switch units, and the scan signal is only transmitted to the first display region, but not transmitted to the second and the third display region, and thus the first display region emits light, and both the second display region and the third display region do not emit light. It can reduce the electrical power consumption of the foldable display device as folding display, and extend the usage duration of the mobile apparatus, and promote the user experience, and meanwhile, diminish the scan signal loading as folding display to promote the display quality. The drive method of the foldable display device of the present invention can reduce the electrical power consumption, and extend the usage duration of the mobile apparatus, and promote the user experience, and meanwhile, diminish the scan signal loading as folding display to promote the display quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A foldable display device, comprising: a flexible substrate (1), a plurality of horizontal scan lines (S1-Sn), which are mutually parallel and in interval on the flexible substrate (1), and a plurality of sub pixels (10) aligned in array on the flexible substrate (1);

wherein one scan line is located corresponding to the sub pixels (10) of each row, and the sub pixels (10) at the same row are electrically coupled to the same scan line;

the flexible substrate (1) comprises: a first display region (100), a first folding region (200), a second display region (300), a second folding region (400) and a third display region (500), which are continuously aligned in sequence along a horizontal direction;

control switch units of one column are respectively located in the first display region (100) and the second display region (300) and located adjacent to the sub pixels (10) of two columns, and each scan line is correspondingly coupled to one of the control switch units, and the control switch unit activates or deactivates the second display region (300) and the third display region (500) under control of a control signal (En).

2. The foldable display device according to claim 1, wherein the control switch unit is a control TFT, and a source and a drain of the control TFT are electrically coupled to a scan line of two sides thereof, respectively, and a gate of the control TFT is electrically coupled to the control signal (En).

3. The foldable display device according to claim 1, wherein the control switch units are in the first folding region (200).

4. The foldable display device according to claim 1, wherein the control switch units are in the second display region (300).

5. The foldable display device according to claim 1, wherein the device further comprises: a first gate driver (21) located at one side of the first display region (100), which is away from the second display region (300), and a second gate driver (22) located at one side of the third display region (500), which is away from the second display region (300);

both the first gate driver (21) and the second gate driver (22) are electrically coupled to the plurality of horizontal scan lines (S1-Sn), which are mutually parallel and in interval;

the second gate driver (22) is electrically coupled to the control signal (En).

6. The foldable display device according to claim 1, wherein the first display region (100), the first folding region (200), the second display region (300), the second folding region (400) and the third display region (500) are continuously aligned from left to right along a horizontal direction;

a control TFT is located on each scan line corresponding to a position between the sub pixels (10) of one column at the most right side of the first display region (100) and the sub pixels (10) of one column at the most left side of the second display region (200), and a source of the control TFT is electrically coupled to a portion of a left side of the scan line where the control TFT is, and a drain is electrically coupled to a portion of a right side of the scan line where the control TFT is, and a gate is electrically coupled to the control signal (En).

7. A drive method of a foldable display device, comprising steps of:

step 1, providing a foldable display device, comprising: a flexible substrate (1), a plurality of horizontal scan lines (S1-Sn), which are mutually parallel and in interval on the flexible substrate (1), and a plurality of sub pixels (10) aligned in array on the flexible substrate (1);

wherein one scan line is located corresponding to the sub pixels (10) of each row, and the sub pixels (10) at the same row are electrically coupled to the same scan line;

the flexible substrate (1) comprises: a first display region (100), a first folding region (200), a second display region (300), a second folding region (400) and a third display region (500), which are aligned in sequence along a horizontal direction;

control switch units of one column are respectively located in the first display region (100) and the second display region (300) and located adjacent to the sub pixels (10) of two columns, and each scan line is correspondingly coupled to one of the control switch units, and the control switch unit activates or deactivates the second display region (300) and the third display region (500) under control of a control signal (En);

step 2, performing folding display to fold the first display region (100), the second display region (300) and the third display region (500) along the first folding region (200) and the second folding region (400) to make that the first display region (100) shades the second display region (300), and the second display region (300) shades the third display region (500), and the control signal (En) provides a deactivation signal to deactivate all the control switch units, and thus the first display region (100) emits light, and both the second display region (300) and the third display region (500) do not emit light;

step 3, performing unfolding display to unfold the first display region (100), the second display region (300) and the third display region (500) along the first folding region (200) and the second folding region (400) to the same plane to make that all the first display region (100), the second display region (300) and the third display region (500) are revealed, and the control signal (En) provides an activation signal to activate all the control switch units, and thus all the first, the second and the third display regions (100, 300, 500) emit light.

8. The drive method of the foldable display device according to claim 7, wherein the control switch unit is a control TFT, and a source and a drain of the control TFT are electrically coupled to a scan line of two sides thereof, respectively, and a gate of the control TFT is electrically coupled to the control signal (En).

9. The drive method of the foldable display device according to claim 7, wherein the control switch units are in the second display region (300) or the first folding region (200).

10. The drive method of the foldable display device according to claim 7, wherein the device further comprises: a first gate driver (21) located at one side of the first display region (100), which is away from the second display region (300), and a second gate driver (22) located at one side of the third display region (500), which is away from the second display region (300);

both the first gate driver (21) and the second gate driver (22) are electrically coupled to the plurality of horizontal scan lines (S1-Sn), which are mutually parallel and in interval;

the second gate driver (22) is electrically coupled to the control signal (En);

in the step 2, the control signal (En) provides a deactivation signal to make the second gate driver (22) stop working;

in the step 3, the control signal (En) provides an activation signal to make the second gate driver (22) normally work.

* * * * *